United States Patent
Ren et al.

(10) Patent No.: US 8,552,804 B1
(45) Date of Patent: Oct. 8, 2013

(54) FREQUENCY SYNTHESIZERS WITH DYNAMIC CALIBRATION INTERVALS

(75) Inventors: Chenxiao Ren, Fremont, CA (US); Tao Jing, Fremont, CA (US)

(73) Assignee: Integrated Device Technology Inc., San Jose, CA (US)

( * ) Notice: Subject to any disclaimer, the term of this patent is extended or adjusted under 35 U.S.C. 154(b) by 0 days.

(21) Appl. No.: 13/249,659

(22) Filed: Sep. 30, 2011

(51) Int. Cl.
*H03L 7/00* (2006.01)

(52) U.S. Cl.
USPC ........ 331/2; 331/46; 331/47; 331/48; 331/55; 331/56

(58) Field of Classification Search
USPC .................... 331/2, 46, 47, 48, 55, 56
See application file for complete search history.

(56) References Cited

U.S. PATENT DOCUMENTS

| | | | | |
|---|---|---|---|---|
| 4,305,041 A | * | 12/1981 | Frerking | 327/39 |
| 5,943,613 A | * | 8/1999 | Wendelrup et al. | 455/343.1 |
| 6,735,454 B1 | * | 5/2004 | Yu et al. | 455/574 |
| 7,890,787 B2 | * | 2/2011 | Bradley et al. | 713/500 |
| 8,183,937 B2 | | 5/2012 | McDonald et al. | |
| 2004/0063473 A1 | * | 4/2004 | Devries et al. | 455/572 |
| 2005/0270108 A1 | * | 12/2005 | Wilson et al. | 331/2 |
| 2006/0223454 A1 | * | 10/2006 | Westwick et al. | 455/76 |
| 2010/0231307 A1 | * | 9/2010 | Walley | 331/47 |

* cited by examiner

*Primary Examiner* — Joseph Chang
*Assistant Examiner* — Jeffrey Shin
(74) *Attorney, Agent, or Firm* — Myers, Bigel et al.

(57) ABSTRACT

An apparatus includes an adjustable oscillator circuit configured to generate an output signal having a frequency that varies responsive to a frequency control signal and a frequency reference generator circuit configured to produce a frequency reference signal. The apparatus further includes a calibration circuit configured to determine a relationship of the output signal to the frequency reference signal and to enable and disable the frequency reference generator circuit based on the determined relationship.

18 Claims, 8 Drawing Sheets

FREQUENCY SYNTHESIZERS WITH DYNAMIC CALIBRATION INTERVALS

FIELD

The inventive subject matter relates to electronic devices and, more particularly, to frequency synthesizers.

BACKGROUND

Electronic devices, such as computers, smart phones and the like, may use frequency synthesizers to generate clock signals that control various functions. For example, devices such as smart phones and notebook computers may use separate 25 MHz and 32 kHz crystal oscillators for communications and real time clock (RTC) functions, respectively. Such an arrangement may be expensive and use an undesirable amount of space. Some devices use a phase-locked loop (PLL) to generate a relatively low-frequency clock signal clock signal (e.g., ~30 kHz) for RTC applications from a relatively high-frequency clock signal (e.g., ~25 MHz) used for communications circuitry. Such conventional PLL-based approaches may, however, utilize relatively inefficient circuitry and, thus, may reduce battery life.

SUMMARY

Some embodiments provide an apparatus including an adjustable oscillator circuit configured to generate an output signal having a frequency that varies responsive to a frequency control signal. The apparatus also includes a frequency reference generator circuit configured to produce a frequency reference signal. The apparatus further includes a calibration circuit configured to determine a relationship of the output signal to the frequency reference signal and to enable and disable the frequency reference generator circuit based on the determined relationship.

For example, the calibration circuit may be configured to compare a measure of transitions of the frequency reference signal occurring during a measurement period defined by the output signal to a reference and to generate the frequency control signal and disable the frequency reference generator circuit responsive to the comparison. The calibration circuit may be configured to determine a difference between the reference and the measure of transitions of the frequency reference signal and to disable the frequency reference generator circuit for a period commensurate with the determined difference. The measurement period may correspond to an integral number of cycles of the output signal.

In further embodiments, the calibration circuit may include an accumulator circuit configured to generate a count of a number of transitions of the frequency reference signal occurring during a measurement period defined by the output signal. The calibration may further include a subtraction circuit configured to determine a difference between the generated count and a reference value and a control circuit configured to generate the frequency control signal and to disable the frequency reference generator circuit based on the determined difference. The control circuit may be configured to disable the frequency reference generator circuit for a period commensurate with the determined difference.

In some embodiments, the adjustable oscillator circuit may be configured to adjust a frequency of the output signal responsive to multiple frequency control signals. The subtraction circuit may be configured to generate a digital word representing the determined difference and the control circuit may be configured to generate respective first and second ones of the frequency control signals responsive to respective bit groups of the digital word. The first and second ones of the frequency control signals may include a coarse frequency control signal and a fine frequency control signal. The accumulator circuit may be configured to generate a digital word representing the count. The subtraction circuit may be configured to generate the digital word digital word representing the determined difference responsive to a first group of bits of the digital word representing the count and the control circuit may be configured to generate a third one of the frequency control signals responsive to a second group of bits of the digital word representing the count.

In some embodiments, the adjustable oscillator circuit may include a capacitor bank configured to be charged and discharged responsive to a comparator signal and to provide a capacitance that varies responsive to a first one of the frequency control signals. The adjustable oscillator circuit may also include a comparator circuit configured to generate the comparator signal responsive to a voltage of the capacitor bank and a reference voltage and a voltage reference circuit configured to generate the reference voltage responsive to a second one of the frequency control signals. The voltage reference circuit may include a resistor bank configured to provide a resistance that varies responsive to the second one of the frequency control signals and the reference voltage may include a voltage at a terminal of the resistor bank.

In additional embodiments of the inventive subject matter, an apparatus includes an adjustable clock generator circuit configured to generate an output clock signal having a frequency that varies responsive to a frequency control signal and a crystal oscillator circuit configured to produce a reference clock signal. The apparatus further includes a calibration circuit configured to determine a relationship of the output clock signal to the reference clock signal and to enable and disable the crystal oscillator circuit based on the determined relationship. The adjustable clock generator circuit may include a controllable oscillator circuit, such as an adjustable RC or ring oscillator.

In additional embodiments, an apparatus includes an adjustable oscillator circuit configured to generate an output signal having a frequency that varies responsive to a frequency control signal and a frequency reference generator circuit configured to produce a frequency reference signal. The apparatus also includes an accumulator circuit configured to generate a count of a number of transitions of the frequency reference signal occurring during a measurement period defined by the output signal. The apparatus further includes a control circuit configured to determine a difference between the generated count and a reference value and to generate the frequency control signal and to disable the frequency reference generator circuit based on the determined difference.

BRIEF DESCRIPTION OF THE DRAWINGS

The accompanying drawings, which are included to provide a further understanding of the inventive subject matter and are incorporated in and constitute a part of this application, illustrate certain embodiment(s) of the inventive subject matter. In the drawings.

DETAILED DESCRIPTION

Embodiments of the present inventive subject matter now will be described more fully hereinafter with reference to the accompanying drawings, in which embodiments of the inventive subject matter are shown. This inventive subject matter may, however, be embodied in many different forms and should not be construed as limited to the embodiments set forth herein. Rather, these embodiments are provided so that this disclosure will be thorough and complete, and will fully convey the scope of the inventive subject matter to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Throughout the specification, like reference numerals in the drawings denote like elements.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

Figure 1:
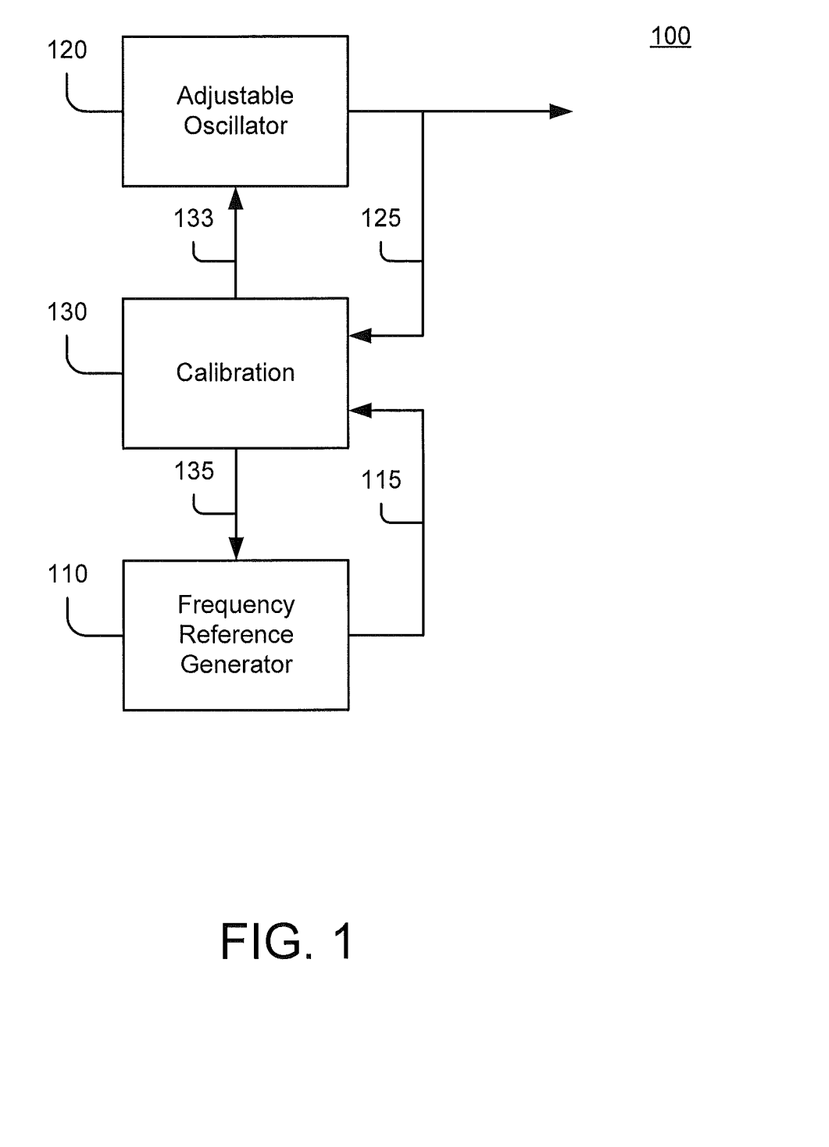
FIG. 1 illustrates a frequency synthesizer apparatus according to some embodiments.

FIG. 1 illustrates an apparatus 100 according to some embodiments of the inventive subject matter. The apparatus 100 includes an adjustable oscillator circuit 120 configured to generate an output signal 125 having a frequency that varies responsive to a frequency control signal 133. A calibration circuit 130 generates the frequency control signal 133 responsive to a frequency reference signal 115 received from a frequency reference generator circuit 110. The calibration circuit 130 is further configured to generate a calibration interval control signal 135 responsive to the frequency reference signal 115 and the output signal 125. The frequency reference generator circuit 110 is configured to be enabled and disabled responsive to the calibration interval control signal 135.

It will be appreciated that the apparatus 100 may be implemented using any of a number of different circuit arrangements and may be utilized in a wide variety of applications. For example, the apparatus 100 may be implemented in a standalone clock signal generator integrated circuit chip and/or may be integrated in a multifunctional device, such as a processor, a peripheral chip (e.g., an RTC chip) or a memory device. The adjustable oscillator circuit 120 may include any of a number of different types of oscillator circuits, such as RC oscillators and ring oscillators. The frequency reference generator circuit 110 may include any of a number of different circuits, including, but not limited to, crystal oscillators.

According to some embodiments, a configuration along the lines of FIG. 1 may be used to generate a low-frequency clock signal, such as a clock signal used for a real time clock, using a high-frequency reference clock signal, such as a clock signal generated by a crystal oscillator. According to further aspects, generation of the high-frequency clock signal may be suspended for intervals that are dependent upon the accuracy of the low-frequency clock signal. In this manner, a relatively accurate low-frequency clock signal may be generated while limiting power consumption associated with generation of the high-frequency clock signal.

Figure 2:
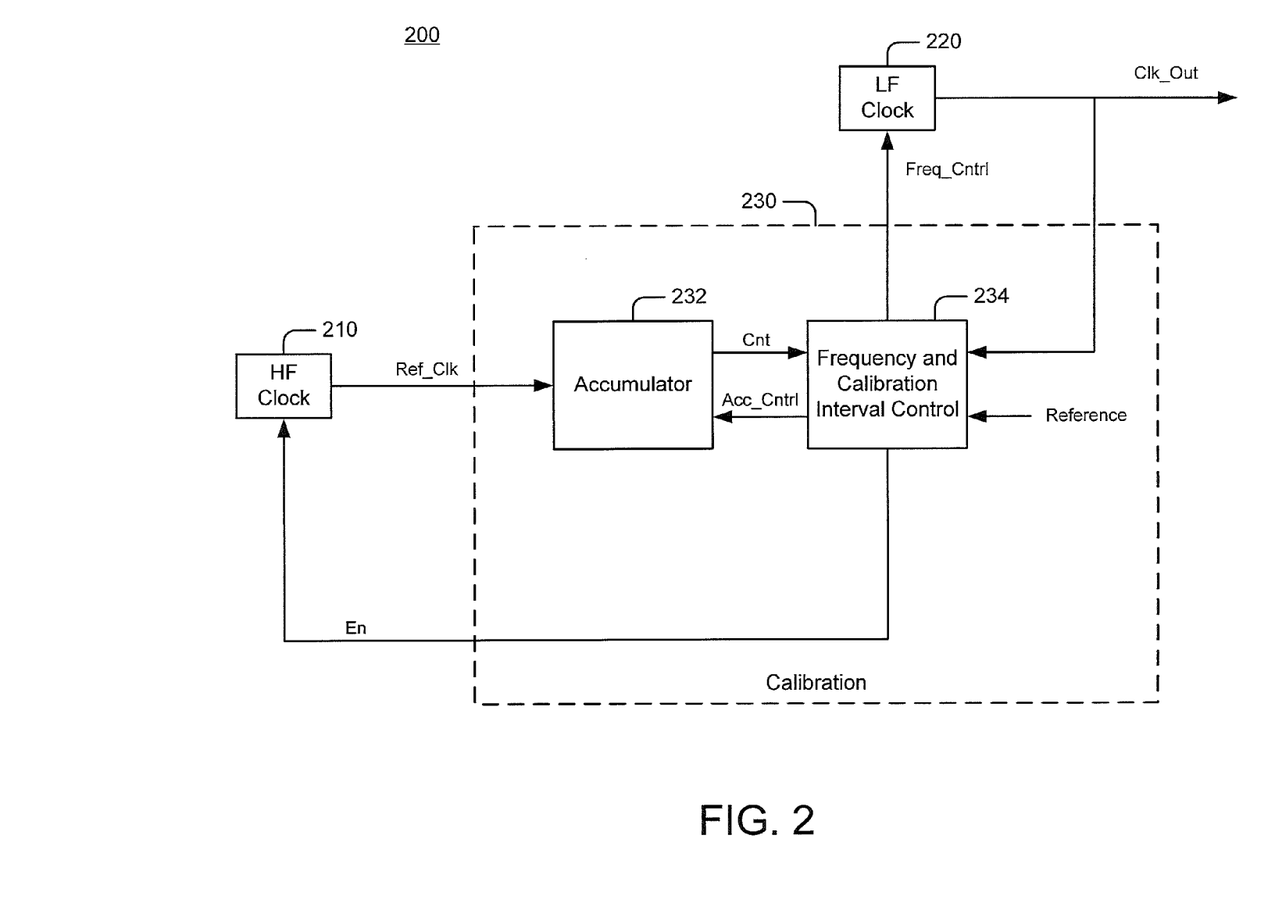
FIG. 2 illustrates a frequency synthesizer apparatus that uses an accumulation of high-frequency clock transitions as a frequency measure according to some embodiments.

Referring to FIG. 2, an apparatus 200 according to some embodiments includes a high-frequency clock signal generator circuit 210. The high-frequency clock signal generator circuit 210 may include, for example, a crystal oscillator circuit. The high-frequency clock signal generator circuit 210 generates a reference clock signal Ref_Clk, which is provided to a calibration circuit 230. The calibration circuit 230 includes an accumulator circuit 232, which is configured to generate a count signal Cnt which represents a count of transitions of the reference clock signal Ref_Clk occurring during a time interval that is defined based on a low-frequency clock signal Clk_Out generated by a low-frequency clock signal generator circuit 220.

In particular, the accumulator circuit 232 is controlled by an accumulator control signal Acc_Cntrl generated by a frequency and calibration interval control circuit 234 responsive to the low-frequency clock signal Clk_Out. The frequency and calibration interval control circuit 234 generates a frequency control signal Freq_Cntrl and an enable signal En responsive to the count Cnt. The low-frequency clock signal generator circuit 220 generates the low-frequency clock signal Clk_Out responsive to the frequency control signal Freq_Cntrl. The high-frequency clock generator circuit 210 is configured to be enabled and disabled responsive to the enable signal En.

As noted, the count Cnt generated by the accumulator circuit 232 represents a number of transitions of the reference clock signal Ref_Clk occurring during a time interval defined by the low-frequency clock signal Clk_Out. The frequency and calibration interval control circuit 234 may compare the count Cnt to a predetermined reference, which may be a value corresponding to a desired frequency of the low-frequency clock signal Clk_Out. The frequency and calibration interval control circuit 234 generates the frequency control signal Freq_Cntrl responsive to the comparison, such that the output clock signal Clk_Out converges on the desired frequency.

The frequency and calibration interval control circuit 234 may also control a duration for which generation of the high-frequency clock signal Ref_Clk is disabled or suspended based on the comparison of the count Cnt to the predetermined reference. In particular, the frequency and calibration interval control circuit 234 may generate an enable signal En which enables and disables the high-frequency clock signal generator circuit 210 responsive to a difference measure generated by comparing the count Cnt to the reference. The duration of the suspension of the high-frequency clock signal Ref may be inversely proportional to this difference, e.g., the greater the difference, the shorter the duration of the suspension, such that the low-frequency output clock signal generator circuit 220 may be more frequently calibrated to more quickly bring its output closer to the desired frequency.

Figure 3:
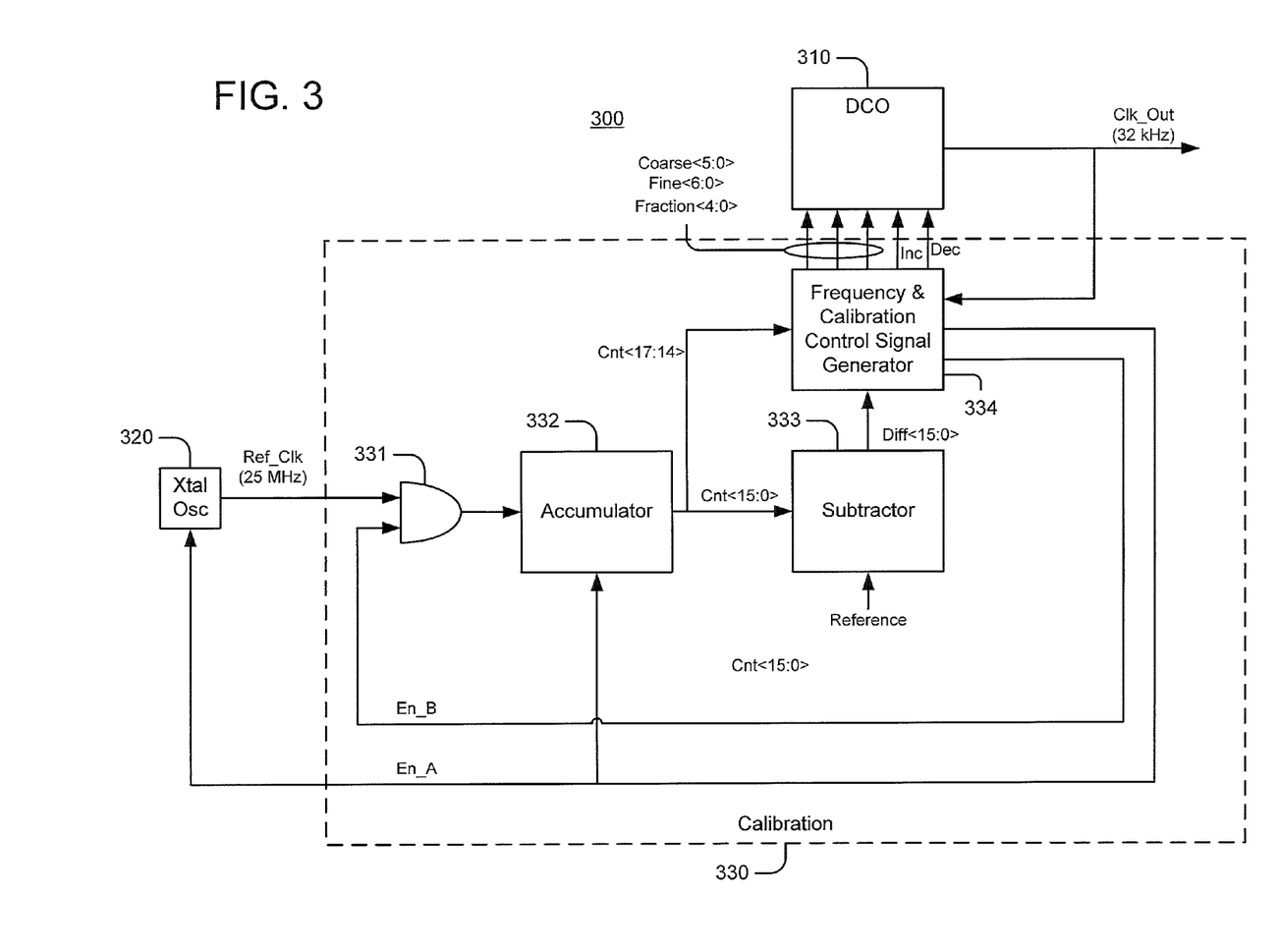
FIG. 3 illustrates a frequency synthesizer apparatus according to further embodiments.

FIG. 3 illustrates an exemplary implementation of an apparatus along the lines described above. An apparatus 300 includes a crystal oscillator 310 that generates a high-frequency reference clock signal Ref_Clk (e.g., a 25 MHz clock signal). The crystal oscillator 310 is configured to be enabled and disabled responsive to a first enable signal En_A.

The high-frequency reference clock signal Ref_Clk is provided to a calibration circuit 330. In particular, the reference clock signal Ref_Clk is provided to a gating circuit 331, which controls provision to of the reference clock signal Ref_Clk to an accumulator circuit 332 responsive to a second enable signal En_B. The accumulator circuit 332 may be reset responsive to the first enable signal En_A and accumulates a digital output word Cnt<17:0> representing a count of transitions of the reference clock signal Ref_Clk occurring a time interval defined by the second enable signal En_B due to the action of the gating circuit 331. Bits Cnt<15:0> of the count word are provided to a subtractor circuit 333, which generates a digital word Diff<15:0> representing a difference between the less significant bits Cnt<15:0> of the count word Cnt<17:0> and a reference value. Bits Cnt<17:14> of the count word are provided directly to a frequency and calibration interval control circuit 334.

The frequency and calibration interval control circuit 334 generates a set of frequency control signals responsive to the difference word Diff<15:0>, including a coarse frequency control signal Coarse<5:0>, a fine frequency control signal Fine<6:0> and a fractional frequency control signal Fraction<4:0>. The frequency and calibration interval control circuit 334 also generates an additional two frequency control signals Inc, Dec responsive to the more significant bits Cnt<17:14> of the control word Cnt<17:0>. As explained in greater detail below, the coarse frequency control signal Coarse<5:0>, the fine frequency control signal Fine<6:0> and the fractional frequency control signal Fraction<4:0> provide respective coarse, fine and fractional changes to the frequency of the output clock signal Clk_Out produced by a digitally controlled oscillator (DC0) circuit 320, while the additional frequency control signals Inc, Dec may be used to provide more rapid convergence of the output frequency under certain conditions.

The frequency and calibration interval control circuit 334 also generates the enable signals En_A, En_B responsive to the output clock signal Clk_Out generated by the DCO circuit 320 and to the difference Diff<15:0>. For example, as explained below, the enable signals En_A, En_B may be controlled such that the accumulator circuit 332 accumulates the count Cnt<17:0> over an integral number of cycles of the output clock signal Clk_Out.

Figure 4:
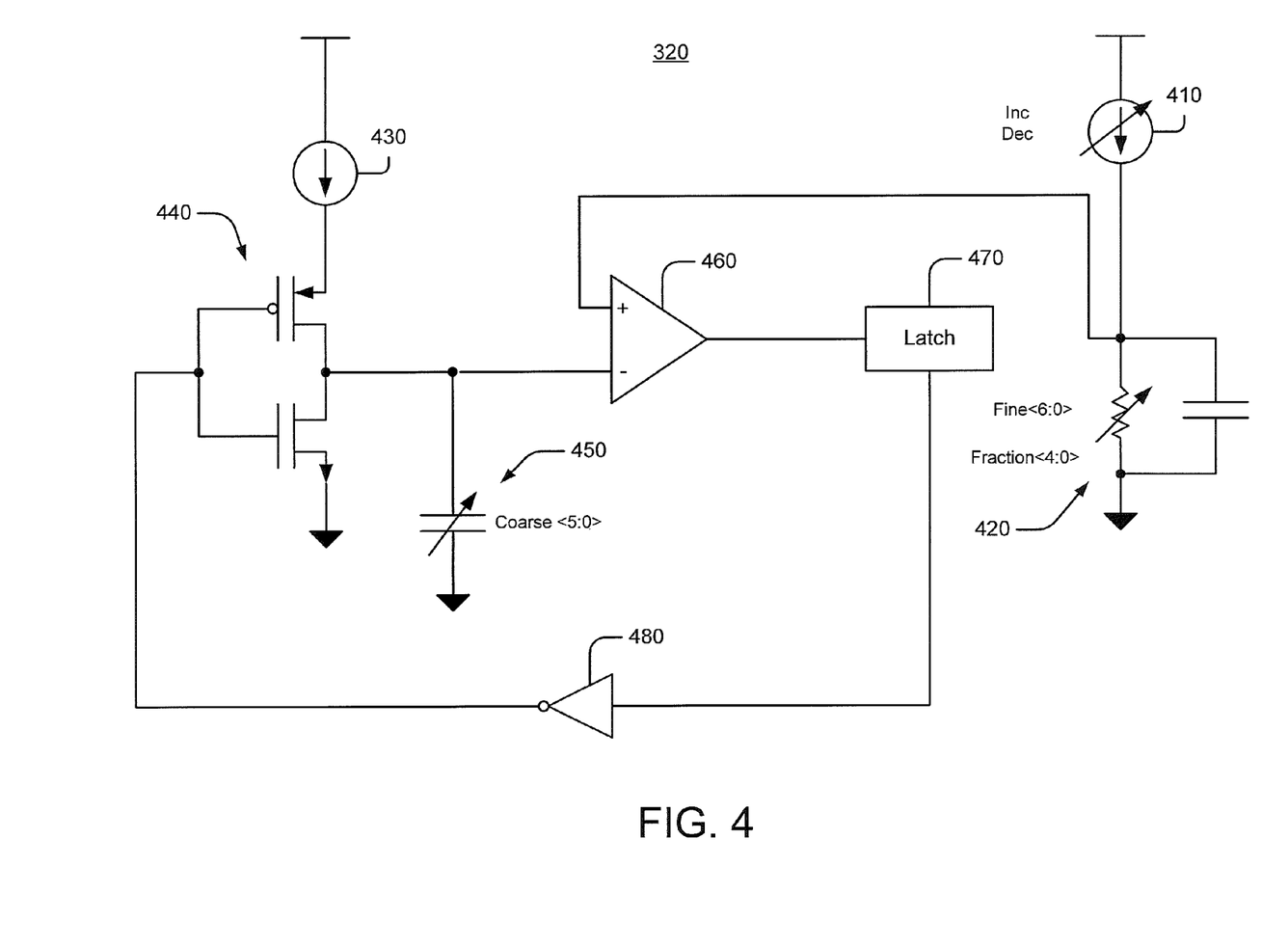
FIG. 4 illustrates digitally-controlled oscillator (DCO) for the apparatus of FIG. 3.

FIG. 4 illustrates an implementation of the DCO circuit 320 according to some embodiments. The DCO circuit 320 illustrated is an RC oscillator circuit including a variable current source 410 configured to supply current to an adjustable current sense resistor bank 520. A reference voltage $v_{ref}$ is generated at a terminal of the resistor bank 520. The resistor bank 520 provides a resistance that is varied responsive to the fine and fractional frequency control signals Fine<6:0>, Fraction<4:0>, which provides for adjustment of the reference voltage $v_{ref}$ responsive to these control signals. The first current source 410 is adjusted responsive to the frequency control signals Inc, Dec generated by the frequency control circuit 334.

The reference voltage $v_{ref}$ is provided to a first input of a comparator 460, and an adjustable capacitor bank 450 is coupled to a second input of the comparator 460. A second current source 430 is coupled to an inverter 440 that is used to charge and discharge the capacitor bank 450. The comparator 460 generates the output clock signal Clk_Out responsive to a comparison of the reference voltage $v_{ref}$ and the voltage on the capacitor bank 450. The inverter 440 is controlled responsive to the output of the comparator 460 via a latch 470 and another inverter 480.

Figure 5:
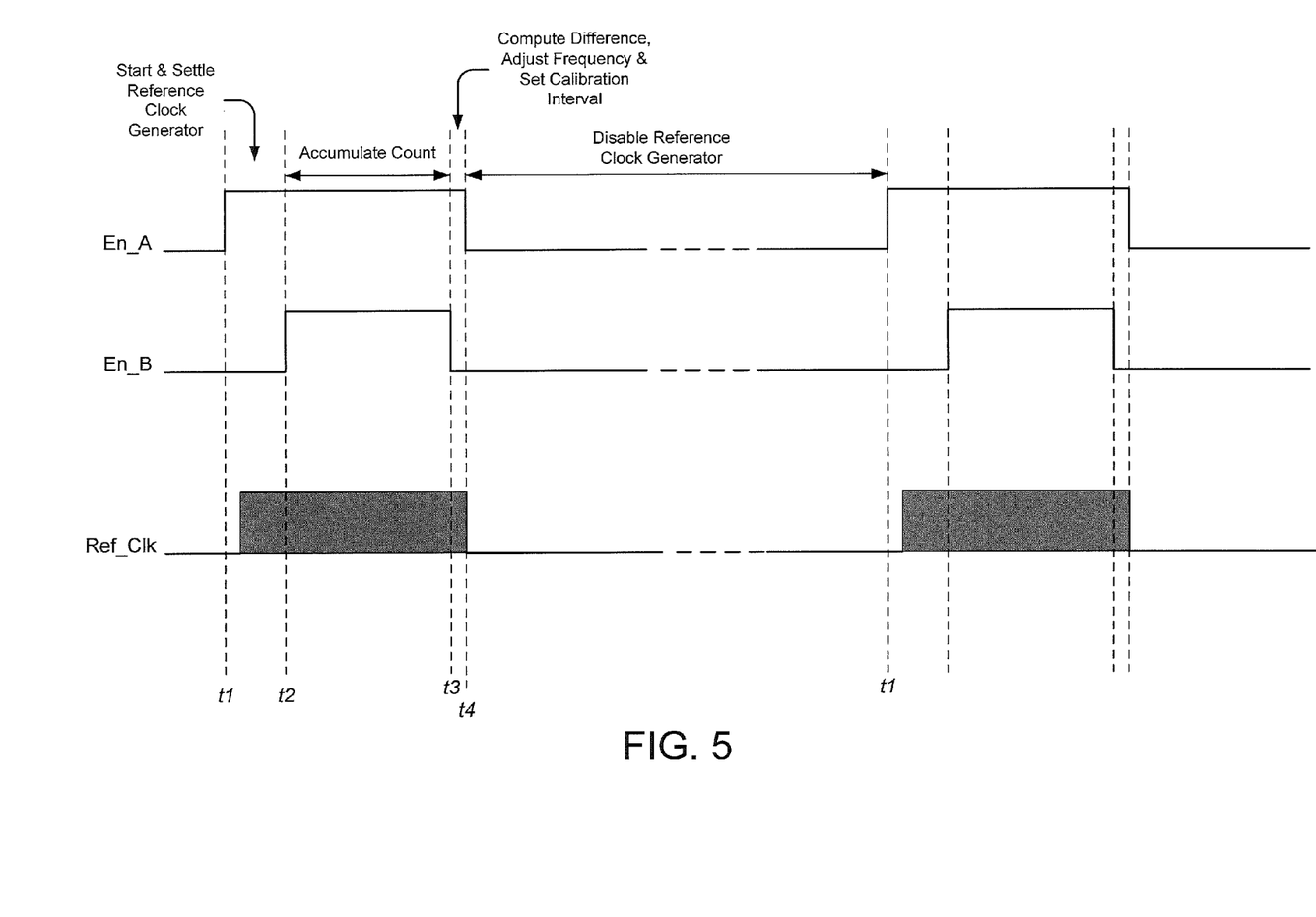
FIG. 5 is a timing diagram illustrating operations of the apparatus of FIGS. 3 and 4.

FIG. 5 illustrates operation of the apparatus 300 of FIG. 3. At a time t1, the first enable signal En_A goes high, enabling the crystal oscillator circuit 310 to start generating the reference clock signal Ref_Clk and resetting the accumulator circuit 332. After a delay sufficient to allow the reference clock signal Ref_Clk to stabilize, the second enable signal En_B is driven high, starting the accumulation of the count Cnt<17:0> by the accumulator circuit 332 at a time t2. After a period defined by the output clock signal Clk_Out, such as a period equal to a certain number of cycles of the output clock signal Clk_Out (e.g., for a 32 kHz output clock signal, 54 cycles), the accumulation terminates at a time t3 with the de-assertion of the second enable signal En_B. After an interval sufficient to compute the difference word Diff<15:0>, generate the frequency control signals Coarse<5:0>, Fine<6:0>, Fraction<4:0>, Inc, Dec and determine the duration of a suspension period of the reference clock signal Ref_Clk before initiation of a next calibration interval, the first enable signal En_A is deasserted to suspend operation of the crystal oscillator circuit 310 at a time t4. After expiration of the suspension interval, a new calibration interval begins.

Figure 6A:
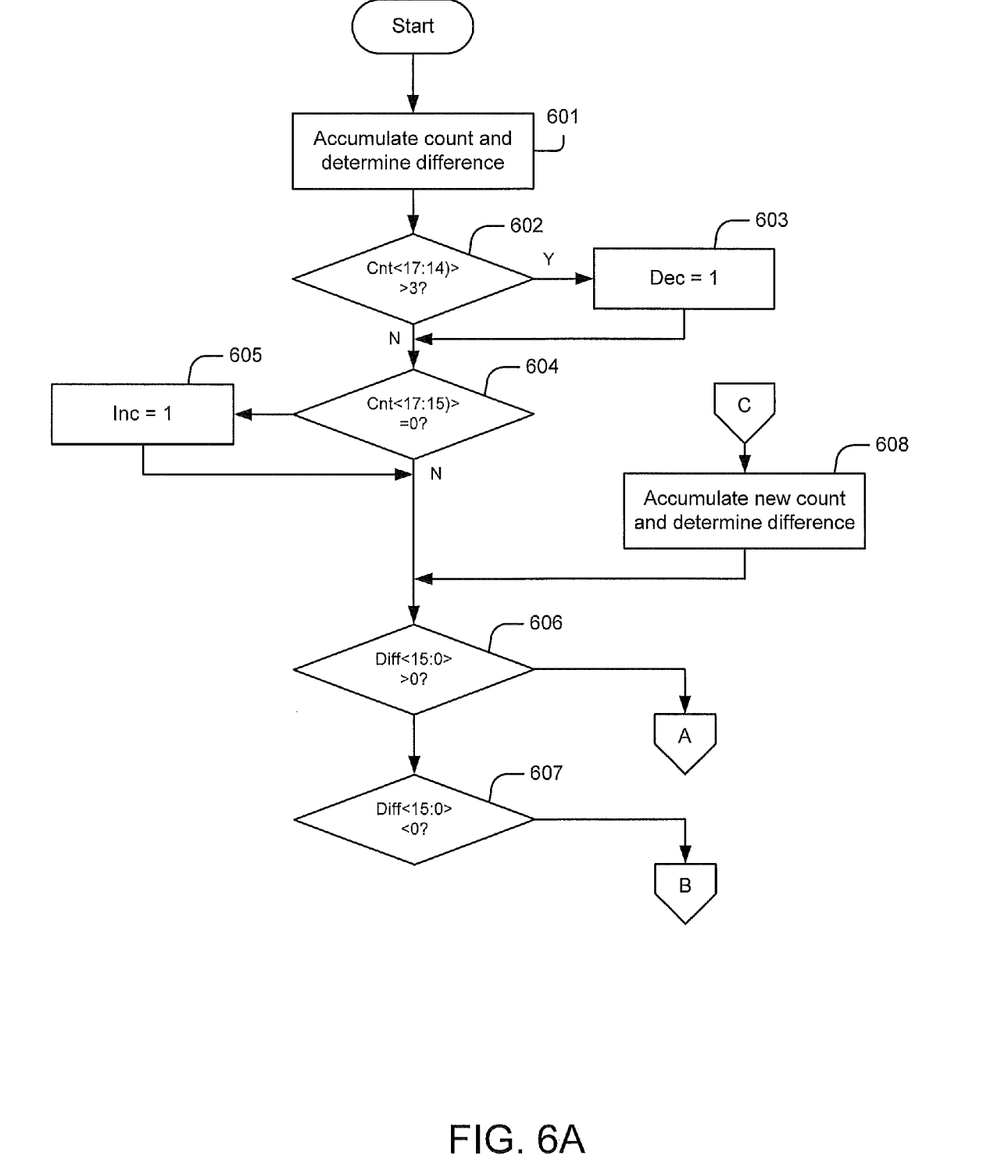
FIGS. 6A-C illustrate a flowchart of operations of the apparatus of FIGS. 3 and 4.
Figure 6B:
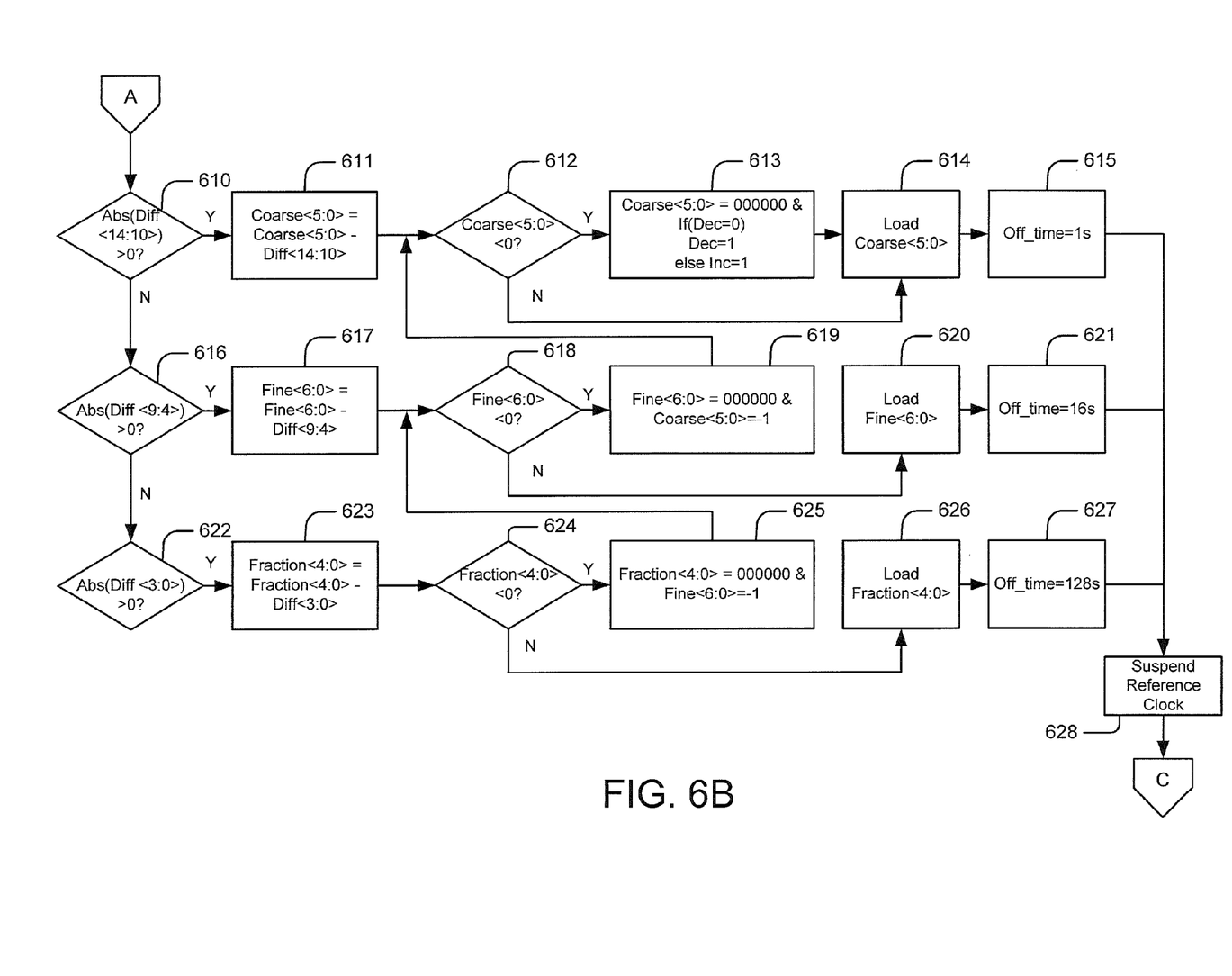
Figure 6C:
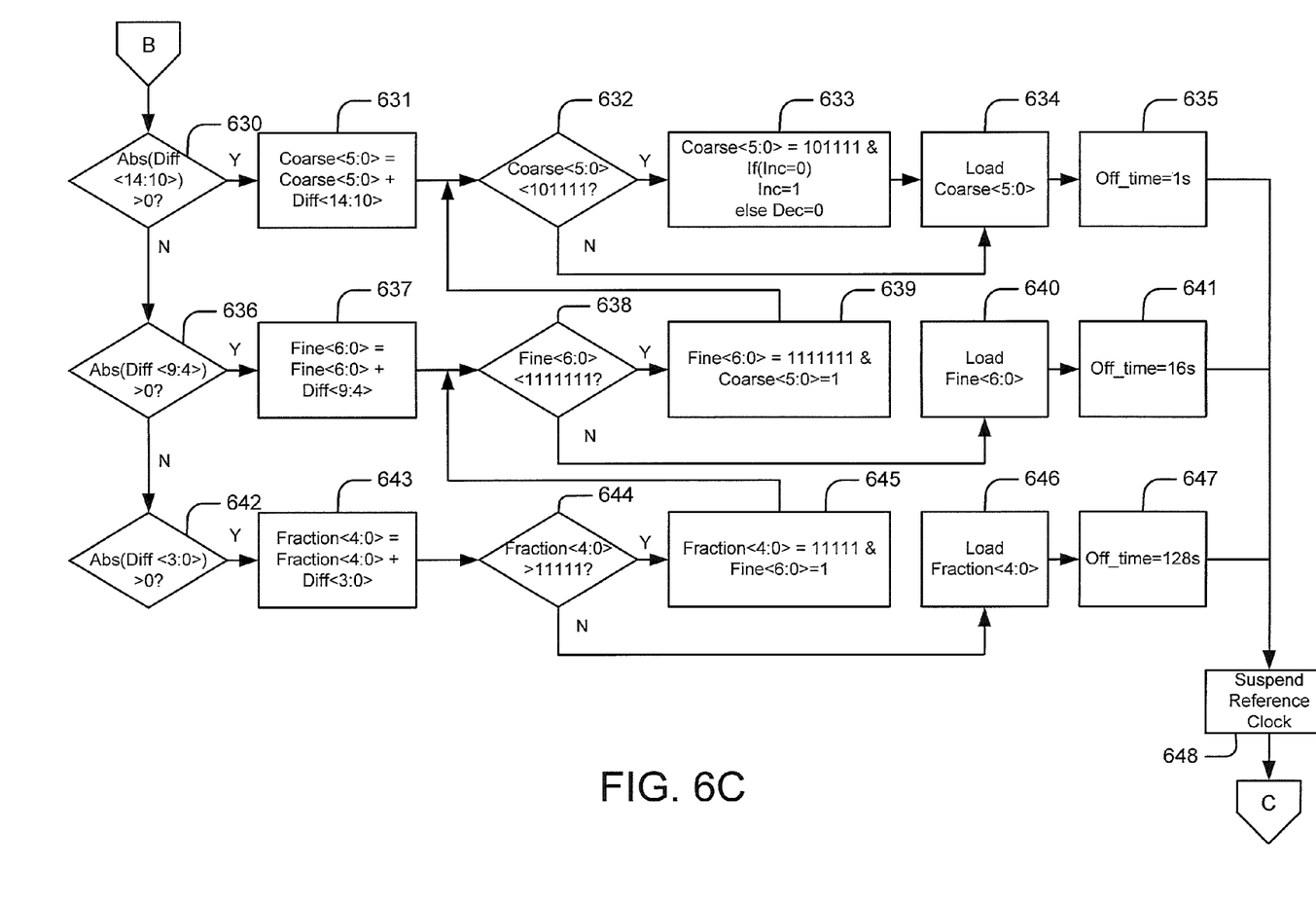

FIGS. 6A-C provide a flowchart of operations of the apparatus 300 according to some embodiments. Referring to FIG. 6A, upon power up, the calibration circuit 330 accumulates a first count and determines a difference of the count with respect to the reference (block 601). As the frequency of the output clock may deviate significantly from the desired frequency at power up, the calibration circuit 330 examines the most significant bits of the count to determine whether a correction should be applied using the frequency control signals Inc, Dec. As shown, if the most significant bits have a value greater than 3, indicating an excessively high frequency for the output clock signal Clk_Out, the frequency control signal Dec is asserted to reduce the output clock frequency (blocks 602, 603). Conversely, if the upper three bits are equal to zero, indicating an excessively low output clock frequency, the frequency control signal Inc is asserted to increase the output clock frequency (blocks 604, 605).

The calibration circuit 330 may then perform various different sequences of operations based on the value of the difference signal Diff<15:0>. In particular, if the difference Diff<15:0> is greater than zero (block 606), the operations of FIG. 6B may be performed (block 606); if the difference Diff<15:0> is less than zero, the operations of FIG. 6 may be performed (block 607).

Referring to FIG. 6B, if Diff<14:10> of the difference Diff<15:0> is greater than zero, a coarse adjustment is performed (block 610). The coarse adjustment involves computing a new coarse adjustment value Coarse<5:0> by subtracting Diff<14:10> from the previous coarse adjustment value Coarse<5:0> (block 611). If the resulting value is less than zero, the coarse adjustment value Coarse<5:0> is set to 000000, the frequency control signal Inc, Dec set appropriately and the new coarse adjustment value Coarse<5:0> is applied to the DCO 320 (blocks 612, 613, 614). If the result of the subtraction is greater than or equal to zero, the coarse adjustment value Coarse<5:0> is applied to the DCO 320 without change, and without changing the other frequency control signals Inc, Dec (blocks 612, 614). The high-frequency clock suspension interval, i.e., the period in which the crystal oscillator 310 is disabled, is set to one second (block 615), and the crystal oscillator 310 is disabled for this suspension interval (block 628).

If Diff<14:10> is not greater than zero, the calibration circuit 330 determines whether a fine adjustment should be attempted. If the magnitude of Diff<9:4> is greater than zero, the fine adjustment is attempted (block 616), which involves computing a new fine adjustment value Fine<6:0> by subtracting the middle group of bits Diff<9:4> from the previous fine adjustment value Fine<6:0> (block 617). If the resulting value is less than zero, the fine adjustment value Fine<6:0> is set to 0000000, the coarse adjustment Coarse<5:0> is set to −1, and the calibration circuit 330 branches back to the coarse adjustment operations described above (blocks 618, 619). If the result of the subtraction is greater than or equal to zero, the fine adjustment value Fine<6:0> is applied to the DCO 320 (blocks 618, 620). The high-frequency clock suspension interval is set to 16 seconds (block 621), and the crystal oscillator 310 is disabled for this suspension interval (block 628).

If Diff<9:4> is not greater than zero, a fractional adjustment may be attempted if Diff<3:0> is greater than zero (block 622). This involves computing a new fractional adjustment value Fraction<4:0> by subtracting Diff<3:0> from the previous fractional adjustment value Fraction<4:0> (block 623). If the resulting value is less than zero, the fractional adjustment value is set to 0000, the fine adjustment Fine<6:0> is set to −1, and the calibration circuit 330 branches back to the fine adjustment operations discussed above (blocks 624, 625). If the result of the subtraction is greater than or equal to zero, the new fractional adjustment value Fraction<4:0> is applied to the DCO (blocks 624, 626). The high-frequency clock suspension interval is set to 128 seconds (block 627), and the crystal oscillator 310 is disabled for this suspension interval (block 628).

FIG. 6C illustrates operations performed if the difference Diff<15:0> is less than zero. Referring to FIG. 6C, if the magnitude of Diff<14:10> is greater than zero, indicating a relatively large frequency error, a coarse adjustment is performed (block 630). The coarse adjustment involves computing a new coarse adjustment value Coarse<5:0> by adding Diff<14:10> to the previous coarse adjustment value Coarse<5:0> (block 631). If the resulting value is greater than 101111, the coarse adjustment value is set to 101111, the frequency control signal Inc, Dec set appropriately and the new coarse adjustment value Coarse<5:0> is applied to the DCO 320 (blocks 632, 633, 634). If the result of the subtraction is greater than or equal to zero, the coarse adjustment value Coarse<5:0> is applied to the DCO 320 without change and without changing the other frequency control signals Inc, Dec (blocks 632, 634). The high-frequency clock suspension interval is set to one second (block 635), and the crystal oscillator 310 is disabled for this suspension interval (block 648).

If Diff<14:10> is greater than zero, the calibration circuit 330 determines whether a fine adjustment should be attempted. If the magnitude of Diff<9:4> is greater than zero, the fine adjustment is attempted (block 636). The fine adjustment involves computing a new fine adjustment value Fine<6:0> by adding Diff<9:4> to the previous fine adjustment value Fine<6:0> (block 637). If the resulting value is greater than 1111111, the fine adjustment value is set to 1111111, the coarse adjustment Coarse<5:0> is set to 1, and the calibration circuit 330 then branches back to the coarse adjustment operations (blocks 638, 639). If the result of the subtraction is greater than or equal to 1111111, the fine adjustment value Fine<6:0> is applied to the DCO (blocks 638, 640). The high-frequency quiescent interval is set to 16 seconds (block 641), and the crystal oscillator 310 is disabled for this suspension interval (block 648).

If Diff<9:4> is not greater than zero, a fractional adjustment may be performed if the least significant bits Diff<3:0> are greater than zero (block 642). The fractional adjustment involves computing a new fractional adjustment value Fraction<4:0> by adding Diff<3:0> to the previous fractional adjustment value Fraction<4:0> (block 643). If the resulting value is greater than 11111, the fractional adjustment value Fraction<4:0> is set to 11111, the final adjustment Fine<6:0> is set to 1, and the calibration circuit 330 branches back to the fine adjustment operations (blocks 644, 645). If the result of the subtraction is less than or equal to 11111, the fractional adjustment value Fraction<4:0> is applied to the DCO 320 (blocks 644, 646). The high-frequency clock suspension interval is set to 128 seconds (block 647), and the crystal oscillator 310 is disabled for this suspension interval (block 648).

As shown on FIG. 6A, after expiration of the suspension intervals (blocks 628, 648) shown on FIGS. 6B and 6C, a new count is accumulated and a new difference with respect to the reference is determined (block 608). Using the new difference value, further adjustment of the DCO 320 may be performed using the operations of FIG. 6B or 6C, depending on the value of the difference. As can be seen from FIGS. 6A-C, calibration occurs at intervals that depend on the frequency error of the DCO 320. It is believed that the initial calibration operations of FIG. 6A should compensate for a large share of the variability of the DCO 320 arising from process variations, and that the calibration operations of FIGS. 6B and 6C should compensate for temperature-induced variation. As temperature variation typically is relatively slow, the frequency of such calibration operations may be relatively low, thus resulting in significant power savings as the crystal oscillator 310 may be disabled for relatively long periods.

It will be understood that the apparatus and operations described above with reference to FIGS. 3-5 and 6A-C are provided for purposes of illustration, and that a wide variety of other implementations may be used. For example, the operations illustrated in FIGS. 6A-C may be modified from those illustrated. Other circuitry than that illustrated in FIGS. 3 and 4 may also be used. For example, some embodiments of the inventive subject matter may use other types of RC oscillator circuits than that shown in FIG. 4, or other types of low-frequency oscillator circuits, such as ring oscillators that use current control inputs to provide frequency control.

In the drawings and specification, there have been disclosed typical embodiments of the inventive subject matter and, although specific terms are employed, they are used in a generic and descriptive sense only and not for purposes of limitation, the scope of the inventive subject matter being set forth in the following claims.

What is claimed is:

1. An apparatus comprising:
an adjustable oscillator circuit configured to generate an output signal having a frequency that varies responsive to a frequency control signal;
a frequency reference generator circuit configured to produce a frequency reference signal; and
a calibration circuit configured to determine a difference between a reference and a measure of transitions of the frequency reference signal occurring during a measurement period defined by the output signal and to disable the frequency reference generator circuit for a period commensurate with the determined difference.

2. The apparatus of claim 1, wherein the measurement period corresponds to an integral number of cycles of the output signal.

3. The apparatus of claim 1, wherein the calibration circuit comprises:
an accumulator circuit configured to generate a count of a number of transitions of the frequency reference signal occurring during a measurement period defined by the output signal;
a subtraction circuit configured to determine a difference between the generated count and a reference value; and
a control circuit configured to generate the frequency control signal and to disable the frequency reference generator circuit based on the determined difference between the generated count and the reference value.

4. The apparatus of claim 3, wherein the control circuit is configured to disable the frequency reference generator circuit for a period commensurate with the determined difference between the generated count and the reference value.

5. The apparatus of claim 3, wherein the adjustable oscillator circuit is configured to adjust a frequency of the output signal responsive to multiple frequency control signals, wherein the subtraction circuit is configured to generate a digital word representing the determined difference between the generated count and the reference value and wherein the control circuit is configured to generate respective first and second ones of the frequency control signals responsive to respective bit groups of the digital word.

6. The apparatus of claim 5, wherein the first and second ones of the frequency control signals comprise a coarse frequency control signal and a fine frequency control signal.

7. The apparatus of claim 5, wherein the accumulator circuit is configured to generate a digital word representing the count, wherein the subtraction circuit is configured to generate the digital word digital word representing the determined difference between the generated count and the reference value responsive to a first group of bits of the digital word representing the count and wherein the control circuit is configured to generate a third one of the frequency control signals responsive to a second group of bits of the digital word representing the count.

8. The apparatus of claim 4, wherein the adjustable oscillator circuit comprises:
a capacitor bank configured to be charged and discharged responsive to a comparator signal and to provide a capacitance that varies responsive to a first one of the frequency control signals;
a comparator circuit configured to generate the comparator signal responsive to a voltage of the capacitor bank and a reference voltage; and
a voltage reference circuit configured to generate the reference voltage responsive to a second one of the frequency control signals.

9. The apparatus of claim 8, wherein the voltage reference circuit comprises a resistor bank configured to provide a resistance that varies responsive to the second one of the frequency control signals and wherein the reference voltage comprises a voltage at a terminal of the resistor bank.

10. An apparatus comprising:
an adjustable clock generator circuit configured to generate an output clock signal having a frequency that varies responsive to a frequency control signal;
a crystal oscillator circuit configured to produce a reference clock signal; and
a calibration circuit configured to determine a difference between a reference and a measure of transitions of the reference clock signal occurring during a measurement period defined by the output clock signal and to disable the crystal oscillator circuit for a period commensurate with the determined difference.

11. The apparatus of claim 10, wherein the adjustable clock generator circuit comprises a controllable oscillator circuit.

12. The apparatus of claim 11, wherein the adjustable clock generator circuit comprises an RC oscillator or a ring oscillator.

13. The apparatus of claim 10, wherein the measurement period corresponds to an integral number of periods of the output clock signal.

14. The apparatus of claim 10, wherein the calibration circuit comprises:
an accumulator circuit configured to generate a count of a number of transitions of the reference clock signal occurring during a measurement period defined by the output clock signal;
a subtraction circuit configured to determine a difference between the generated count and a reference value; and
a control circuit configured to generate the frequency control signal and to disable the crystal oscillator circuit based on the determined difference between the generated count and the reference value.

15. An apparatus comprising:
an adjustable oscillator circuit configured to generate an output signal having a frequency that varies responsive to a frequency control signal;
a frequency reference generator circuit configured to produce a frequency reference signal; and
a calibration circuit configured to generate the frequency control signal based on comparisons of the frequency reference signal to the output signal in respective calibration periods that are variably separated in time based on the comparisons.

16. The apparatus of claim 15, wherein the calibration circuit is configured to disable the frequency reference generator circuit between the calibration periods.

17. The apparatus of claim 16, wherein durations of intervals in which the frequency reference generator circuit is disabled are commensurate with differences between a reference and measures of transitions of the frequency reference signal occurring during measurement periods defined by the output signal.

18. The apparatus of claim 16, wherein the frequency reference generator circuit comprises a crystal oscillator circuit.

* * * * *